(12) United States Patent
Konrath et al.

(10) Patent No.: US 8,014,890 B2
(45) Date of Patent: Sep. 6, 2011

(54) METHOD FOR MANUFACTURING A HIGH-FREQUENCY ASSEMBLY

(75) Inventors: Willibald Konrath, Weissach im Tal (DE); Haiko Schmelcher, Fichtenberg (DE)

(73) Assignee: Ericsson AB, Stockholm (SE)

( * ) Notice: Subject to any disclaimer, the term of this patent is extended or adjusted under 35 U.S.C. 154(b) by 325 days.

(21) Appl. No.: 10/573,698

(22) PCT Filed: Sep. 9, 2004

(86) PCT No.: PCT/EP2004/052116
§ 371 (c)(1),
(2), (4) Date: Dec. 7, 2006

(87) PCT Pub. No.: WO2005/032221
PCT Pub. Date: Apr. 7, 2005

(65) Prior Publication Data
US 2007/0208449 A1 Sep. 6, 2007

(30) Foreign Application Priority Data
Sep. 25, 2003 (DE) .................................. 103 44 409

(51) Int. Cl.
*G06F 19/00* (2011.01)

(52) U.S. Cl. .......................................... 700/121; 29/832
(58) Field of Classification Search .................... 700/95, 700/108–110, 121, 116; 702/81–84, 182–185; 29/825, 832
See application file for complete search history.

(56) References Cited

U.S. PATENT DOCUMENTS

| | | | | |
|---|---|---|---|---|
| 4,494,095 A * | 1/1985 | Noji et al. ........................ 334/85 |
| 4,707,657 A * | 11/1987 | Boegh-Petersen ............. 324/537 |
| 4,833,402 A * | 5/1989 | Boegh-Petersen ............. 324/754 |
| 5,086,397 A * | 2/1992 | Schuster et al. ............. 700/110 |
| 5,539,976 A | 7/1996 | Miyauchi et al. |
| 5,680,936 A * | 10/1997 | Beers ............................. 209/564 |
| 6,020,751 A * | 2/2000 | Rampone et al. ............. 324/765 |
| 6,084,487 A * | 7/2000 | Hoffman ....................... 333/202 |
| 6,618,937 B2 * | 9/2003 | Onitsuka ......................... 29/832 |
| 6,681,038 B2 * | 1/2004 | Vilella .......................... 382/145 |
| 6,801,652 B1 | 10/2004 | Stanzl et al. |
| 6,816,037 B2 * | 11/2004 | Hoffman ....................... 333/202 |
| 6,870,438 B1 * | 3/2005 | Shino et al. .................... 333/26 |
| 6,938,335 B2 | 9/2005 | Kuribayashi et al. |
| 7,142,939 B2 * | 11/2006 | Nonaka et al. ............. 700/121 |
| 2002/0067228 A1 * | 6/2002 | Hoffman ....................... 333/202 |
| 2003/0016026 A1 * | 1/2003 | Kawaike et al. ............. 324/537 |
| 2003/0115568 A1 * | 6/2003 | Miller et al. .................. 716/15 |
| 2004/0095157 A1 * | 5/2004 | Sato et al. .................... 324/754 |

FOREIGN PATENT DOCUMENTS

| | | |
|---|---|---|
| CN | 1320358 A | 10/2001 |
| JP | 62-022498 | 1/1987 |
| JP | 63-191205 | 8/1988 |
| JP | 04-056200 | 2/1992 |
| JP | 07-066595 | 3/1995 |
| JP | 2000-294985 | 10/2000 |
| WO | 01/63670 A2 | 8/2001 |
| WO | WO 2005/032221 * | 4/2005 |

* cited by examiner

*Primary Examiner* — Charles R Kasenge
(74) *Attorney, Agent, or Firm* — Coats & Bennett, P.L.L.C.

(57) ABSTRACT

In the manufacture of a high-frequency assembly, a plurality of components, at least one (12) of which is frequency-specific, are placed with respect to each other using a placing apparatus and are interconnected. In a specimen of the frequency-specific component (12, 30) a feature (23, 24) which encodes the frequency is looked for. The specimen is built in if the feature (23, 24; 26) is found in the specimen and is judged to be correct; otherwise the specimen is rejected.

19 Claims, 2 Drawing Sheets

METHOD FOR MANUFACTURING A HIGH-FREQUENCY ASSEMBLY

The present invention relates to a method for the automatic manufacture of a high-frequency assembly.

Such assemblies are frequently manufactured in a plurality of versions for various frequency ranges. Among the components built into such an assembly, there may be some which are specific for the working frequency for which the assembly is intended, but which differ only little in appearance from corresponding components for other working frequencies. Among such frequency-specific components, there are e.g. microstrip filters, waveguide junctions, resonators, etc.

If these components are stocked in different versions for different working frequencies in order to be able to build assemblies with different working frequencies according to need, there is a risk that such components are confused and that e.g. an automatic manufacturing device is supplied with components for different working frequencies and assembles these. This may cause an entire batch of assemblies to be found non-operational in a functionality check at the end of the manufacture, so that the assemblies must be discarded or modified at high expense of cost and labour.

The object of the present invention is to provide a method for manufacturing a high frequency assembly, frequency-specific components for such a method and a manufacturing device for carrying out such a method, which avoids such mistakes.

The object may be achieved by a method having the features of claim 1, a component having the features of claim 13, and an assembly apparatus having the features of claim 14.

The component of the invention is provided with a machine-detectable feature, which is representative of a specific working frequency of the component. The manufacturing apparatus comprises means for detecting the representative feature of each such component and for deciding, based on the specific working frequency of the component detected therefrom, whether the component may be built-in or must be rejected.

The rejection may be a mere sorting out of each specimen of the component in which the feature representative of the desired working frequency is not found; it may further comprise outputting a warning to a person in charge or the like.

When the specimens of a frequency-specific component to be used in a high frequency assembly are taken from a stock, the stock is advantageously rejected as a whole if several specimens of the frequency-specific component taken from the stock one after the other have been rejected. In this case, it has to be assumed that by mistake, a stock with components laid out for the wrong frequency has been supplied, and that even if further specimens are taken from the stock, they will all have the wrong working frequency. By exchanging the complete stock in such a case, a long interruption of the manufacturing process is avoided.

Advantageously, the machine verification of the working frequency of such a component may be combined with the detection of its orientation, which has to be known in order to place the component correctly on a substrate such as a circuit board—or, in case of the substrate itself being a frequency-specific component on which the method is to be applied—to place the substrate in correct orientation on a support means of the manufacturing apparatus. To this end, the frequency-encoding feature may be sought at a plurality of locations of each specimen of the frequency-specific component, and an orientation of the specimen is decided based on the one among the investigated locations at which the frequency-specific feature is indeed found.

This object may be achieved expediently by finding at a component to be mounted a reference direction such as the orientation of an edge and a reference point such as the centre which is easy to detect anyway when the edges have been detected, by forming a number of vectors of a same length originating from said reference point under respective pre-defined angles with respect to the reference direction, and by defining locations at which the frequency-specific feature is looked for at the respective ends of the vectors. Preferably, the ends of the vectors form a square, since this can be done with little processing effort. In particular, in case of a component which is assumed to be rectangular, defining a square does not require a decision about which one of several detected edges is the longer one and which is the shorter one.

If the various embodiments of the frequency-specific feature that represent different working frequencies can be transformed into one another by rotation, the orientation of the component must be taken account of for distinguishing between the embodiments.

For detecting the working frequency and the orientation of the component, it is also possible to look for the frequency-specific feature within a detected outline without restriction to certain locations and then to deduce the orientation of the component from the relative location at which the feature was found with respect to the outline of the component.

Specifically, if the frequency-specific component is a conductor substrate, the frequency-specific feature may be formed from the same material as the conductors. Thus, the production of a component according to the invention is not more laborious than of a conventional one.

The frequency-specific component may also be a mechanical component, in particular a cover for another component mounted underneath on a circuit board, e.g. an end cover for a hollow waveguide, also referred to as a back-short. Especially in this case, a bore may be appropriate as a frequency-specific feature.

Otherwise, the frequency-specific feature may simply be printed.

Further features and embodiments of the invention become apparent from the subsequent description of embodiments thereof, referring to the appended drawings.

Figure 1:
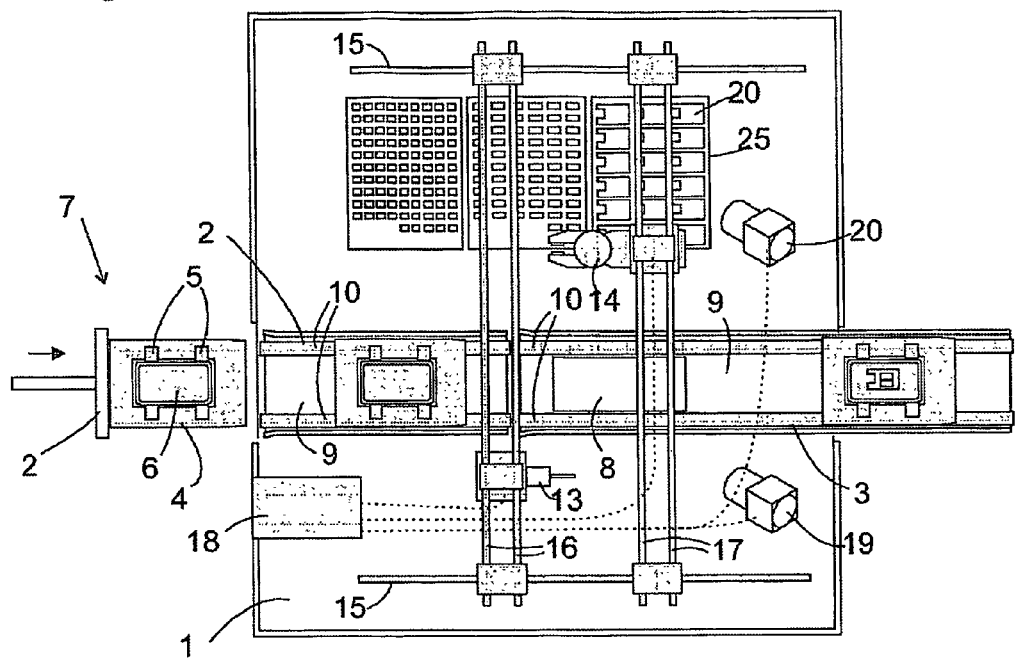
FIG. 1 is a schematic plan view of an automatic assembling apparatus with which the method of the invention may be carried out.

FIG. 1 is a schematic plan view of an automatic assembling apparatus with which the method of the invention can be carried out. On a vibration-damped table top 1, the apparatus comprises two belt conveyor devices 2, 3 for conveying circuit carriers 4, on which a circuit board 6 for assembly is fixed by clamps 5, from a magazine loader 7, not shown in detail, to an assembly location 8, and, after assembly, out of the assembly apparatus for further processing. The belt conveyor devices 2, 3 each have an elongated horizontal plate 9, which has driven belts 10 wound around lateral regions thereof, on which belts rest the circuit carriers 4 to be conveyed. The circuit carriers 4 are guided with little play between lateral flanks 11.

The assembly location 8 is formed by a vertically displaceable table which is set in the plate 9 and is raised against an abutment for the assembly procedure, so as to lift the circuit carrier 4 off the belts 10 and bring it into an exactly defined and reproducibly settable height.

A dispenser 13 for adhesive and a gripper 14 are displaceable parallel to the conveying direction of the belt conveyor devices 2, 3 along rails 15 and perpendicular to the conveying direction along rails 16, 17. Further, the dispenser 13 and the gripper 14 are vertically displaceable. A control circuit 18 controls the movements of the dispenser 13 and the gripper 14 based on construction data of a circuit to be mounted on the circuit board 6. In order to receive these construction data, the control circuit 18 has a digital interface and/or a reader for mobile data carriers.

Among the construction data received by control circuit 18, there are indications about a desired working frequency of the frequency-specific components used in the assembly which is being manufactured.

Further, the control circuit 18 is coupled to a camera 19, which is held above the table top and is directed to the assembly location 8 and allows to optically inspect the circuit board 6 and components to be placed on circuit board 6 before placement on circuit board 6 in a manner which is described in more detail later on.

Alternatively, the task of optically inspecting components to be assembled may be carried out by a second camera 20, which is directed towards stock containers or pallets 25 in which the components to be mounted are supplied to the assembling apparatus. The second camera 20 allows for an inspection of the components to be mounted before these are taken up by the gripper 14 and can thus contribute to an acceleration of the assembling process by carrying out an optical inspection of the components before they are taken up by gripper 14, when ever processing capacity of the control circuit 18 is available therefore.

Figure 2:
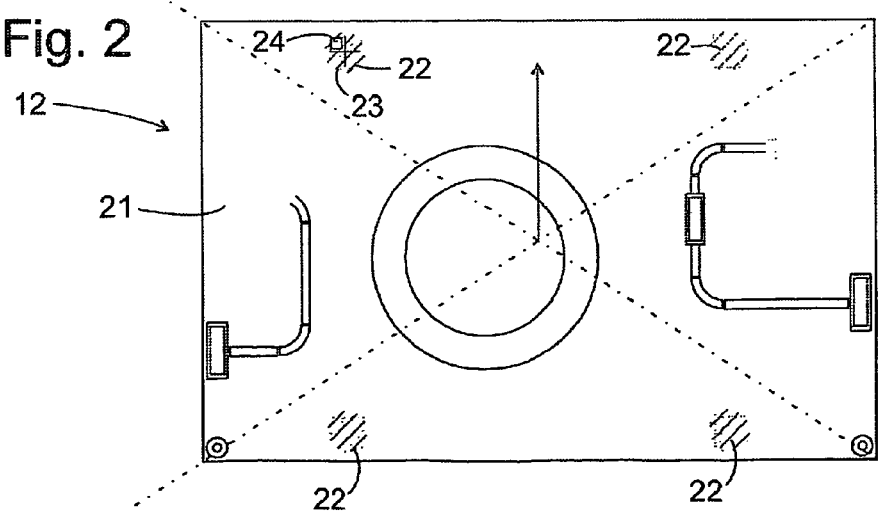
FIG. 2 is a schematic plan view of a first example of a circuit component according to the invention.

The optical inspection of the components to be placed, which the control circuit 18 carries out by means of the camera 19 or 20, will be illustrated by means of FIG. 2, which shows a schematic plan view of such a component 12, in which features of the component 12 which are relevant for its technical function in the circuit are shown only very schematically, since the present invention does not rely on them.

The component 12 of FIG. 4 may e.g. be a ring oscillator formed on a ceramic substrate 21, of which only the oscillator ring and some contact pads and conductor portions are shown.

The substrate 21 of component 12 is rectangular. This fact is assumed to be true by the control circuit 18 when inspecting component 12. In order to find the geometrical centre of substrate 21, it is therefore sufficient that, by a simple evaluation of contrasts of an image provided by camera 19 or 20, the control circuit 18 detects the course of its four edges and, hence, the positions of its corners. In order to find the centre, it is sufficient to determine the intersection of two straight lines shown as dash-dot lines in FIG. 2, which extend through opposite corners of the substrate 21.

Knowing the position of the centre and the orientation of one of the edges of substrate 21 detected earlier already, the control circuit 18 generates four vectors of equal length, which extend from the centre under angles of 45°, 135°, 225° or 315° with respect to the selected edge. No matter which one of the four edges of the substrate is selected, the ends of these vectors will always be at the same locations of the substrate. These locations 22 are represented as loosely hatched patches in FIG. 2. At a single one of these locations 22, the upper left one in FIG. 2, there is an orientation feature 23, here in the shape of a cross, formed on the substrate. The orientation feature 23 can be made of the same material as conductors, which are present on the surface of substrate 21, and may be formed together with these in a single processing step; alternatively, the feature might be a coloured impression. The control circuit 18 recognizes the orientation of the substrate from the one of the four investigated locations 22 at which it recognizes the orientation feature 23.

In one of the four quadrants defined by the cross, a square 24 is formed by the technique which was also used for forming the cross, and which is also detected by camera 19 or 20 when seeking the orientation feature 23. When the control circuit 18 has detected the orientation of the substrate, it is also capable of unequivocally distinguishing the four quadrants defined by cross 23 and to distinguish, according to in which one of the four quadrants this square 24 is formed, four cases corresponding to different working frequencies of the component 12.

The control circuit 18 compares the thus determined working frequency of component 12 with a working frequency specified for this component in the construction data supplied to it. In case of agreement, the component 12 is placed on the circuit board 6 under assembly; in case of non-agreement, the component 12 is put aside, and a new corresponding component 12 is fetched from component supply 25 using gripper 14.

For this newly fetched component 12, the process of detecting the orientation and the working frequency of the fetched component 12, of comparing the detected and the desired working frequencies and placing the component 12 only in case of agreement, are repeated.

When it is found for a predetermined number of successively fetched components 12 that the working frequency coded on them does not agree with the working frequency specified in the construction data, the control circuit 18 concludes that the entire stock 25 of specimens of this component 12 to which the gripper 14 can accede is wrong. In this case, the control circuit 18 generates an error message in order to direct the attention of a person in charge to the problem and to cause him/her to replace the entire stock 25 of the concerned component.

The method described above, in which initially, a plurality of locations 22 is detected at the surface of a component 12 based on the position of its edges is particularly appropriate for large surface component in which looking for a frequency-encoding feature on the entire surface would be tedious or error prone due to a rich structure of the component. In contrast, for small sized components such as back-shorts, a simplified method is carried out.

Figure 3:
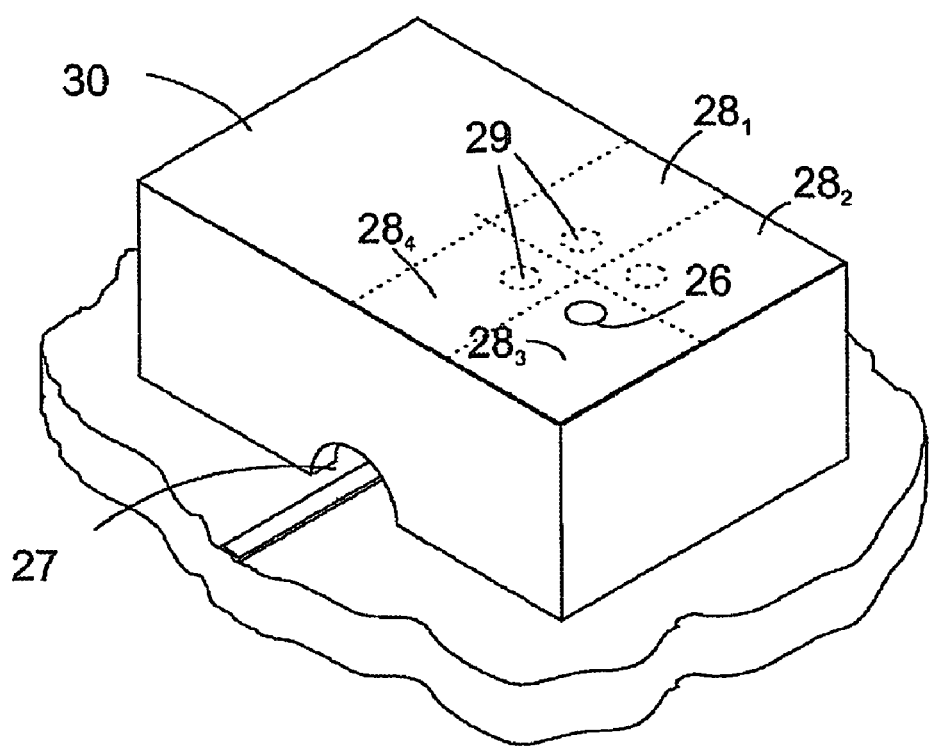
FIG. 3 is a schematic plan view of a second circuit component according to the invention, together with a fraction of a substrate on which it is mounted.

FIG. 3 is perspective view of a back-short 30 adapted for carrying out the method. At the upper side of back-short 30, there is a plurality of locations 29, represented as circles in the Figure, where according to the working frequency for which the back-short 30 is intended, a bore 26, represented as a solid circle, may be located. All locations 29 are on one half of the surface of the back-short 30, in the present case, if the side of the back-short 30 at which a cut-out 27 for leading out a strip conductor is formed is referred to as "down", the right-hand half.

In order to detect the orientation of a back-short 30 taken up by a gripper 14, the control circuit 18 looks for a bore 26 in the entire image of the upper side of the back-short provided by camera 19. If the bore 26 is found, the half of the upper side in which it is located is identified as the right half, and the detection of the orientation of the back-short 30 is accomplished.

The control circuit 18 subdivides the right half of the upper side into several sections $28_1$ to $28_4$. In the Figure, these sections are separated from each other and from the left-hand half of the upper side by dashed lines, but these lines only serve as an orientation for the viewer; in the real back-short 30, they do no exist. The control circuit 18 recognizes a working frequency of the bask-short from in which of the sections $28_1$ to $28_4$ the bore 26 is located (section $28_3$ in the present case).

As described above already, the control circuit 18 compares the thus detected working frequency of the back-short with a working frequency specified in the construction data and places the back-short only in case that the frequencies agree with each other. If a working frequency that does not fit the construction data has been detected successively in several back-shorts, an error message is generated here, too, in order to cause the entire stock to be replaced.

Of course, there are a variety of other possibilities for encoding the operational frequency of a circuit component beside those explained relating to FIGS. 2 and 3. E.g., the number of sections 28 in which the upper side of the back-short or any other component may be subdivided in order to detect a frequency encoded thereon is in principle only limited by the resolution of the camera 19; further, it may be allowed to place several frequency-encoding features such as the bores 26 or the squares 24 at a component. Thus, e.g. in case of FIG. 2, up to sixteen frequencies may be encoded if any number of squares 24 between 0 and 4 and any distribution thereof to the four quadrants of the cross 23 is permitted. The number of possibilities of differentiation increases further if a distinction is made between different positions of the squares within a quadrant, etc. In case of FIG. 3, 2n–1 different encodings are possible if n is the number of distinct sections. A complete lack of a bore 26 cannot be admitted in this case, since then it is not possible to detect the orientation, either.

The invention claimed is:

1. A method of manufacturing a high-frequency assembly including a plurality of components, at least one of which is frequency-specific, using an automatic assembly apparatus, the method comprising:
   placing a plurality of components on a high-frequency assembly using a placing apparatus of an automatic assembly apparatus;
   identifying a frequency-encoding feature on a frequency-specific component prior to gripping the frequency-specific component with the placing apparatus, the frequency-encoding feature indicating an operating frequency of the frequency-specific component;
   accepting the frequency-specific component for connection to the high-frequency assembly if the frequency-encoding feature indicates that the frequency-specific component is a correct component for the assembly; and
   rejecting the frequency-specific component for connection to the high-frequency assembly if the frequency-encoding feature indicates that the frequency-specific component is not the correct component for the assembly.

2. The method of claim 1 wherein the frequency-specific component is taken from a stock that comprises a plurality of frequency-specific components, the method further comprising:
   rejecting the entire stock of frequency-specific components if a predetermined number of frequency-specific components in the stock are successively rejected for connection.

3. The method of claim 1 further comprising:
   searching for the frequency-encoding feature at a plurality of locations on the frequency-specific component; and
   determining an orientation of the frequency-specific component based on a location at which the frequency-encoding feature is found.

4. The method of claim 3 further comprising:
   identifying a reference point and a reference direction on the frequency-specific component;
   forming a number of vectors beginning at the reference point, the vectors being of substantially equivalent length and forming pre-defined angles with respect to the reference direction; and
   searching for the frequency-encoding feature at the ends of the vectors.

5. The method of claim 4 wherein each vector includes an end that terminates at a corner of a square.

6. The method of claim 4 further comprising:
   determining a rotational position of the frequency-encoding feature; and
   distinguishing which of a plurality of features is indicated by the frequency-encoding feature based on the rotational position of the frequency-specific component.

7. The method of claim 1 further comprising:
   detecting an outline of the frequency-specific component;
   locating the frequency-encoded feature based on the detected outline of the frequency-specific component; and
   determining an orientation of the frequency-specific component based on the located frequency-encoded feature.

8. The method of claim 1 wherein the frequency-specific component comprises a circuit board.

9. The method of claim 8 wherein the frequency-encoded feature comprises a conductive material.

10. The method of claim 1 wherein the frequency-specific component comprises a mechanical component.

11. The method of claim 10 wherein the mechanical component comprises a cover that covers a mounted component.

12. The method of claim 1 wherein the frequency-encoded feature comprises a bore.

13. The method of claim 1 wherein the frequency-encoded feature comprises an indication printed on the frequency-specific component.

14. The method of claim 1, wherein the step of identifying the frequency-encoding feature comprises optically identifying said frequency-encoding feature.

15. A manufacturing apparatus for the automatic manufacture of a high-frequency assembly comprising:
   a placing apparatus to place one or more components on a high-frequency assembly, wherein at least one of the components comprises a frequency-specific component;

a sensor to detect a frequency-encoded feature associated with the frequency-specific component that indicates an operating frequency of the frequency-specific component;

a controller operatively connected to the sensor and configured to:

receive a signal from the sensor responsive to the detection of the frequency-encoded feature; and control the placing apparatus to place the frequency-specific component on the assembly, or to reject the frequency-specific component based on the received signal prior to the component being taken up by the placing apparatus.

16. The apparatus of claim 15 wherein the orientation of the frequency-specific component can be determined from a location at which the feature is found on the frequency-specific component in relation to a reference edge of the component.

17. The apparatus of claim 15 wherein the orientation of the frequency-specific component can be determined from a location at which the frequency-encoded feature is found with respect to the outline of the frequency-specific component.

18. The apparatus of claim 15 wherein the frequency-encoded feature is an optically detectable feature.

19. The apparatus of claim 15, wherein the sensor is a camera.

* * * * *